United States Patent
Paul

(10) Patent No.: US 9,778,337 B2
(45) Date of Patent: Oct. 3, 2017

(54) METHOD AND MAGNETIC RESONANCE SYSTEM TO ACQUIRE MR DATA IN A PREDETERMINED VOLUME SEGMENT

(71) Applicant: Dominik Paul, Bubenreuth (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 1142 days.

(21) Appl. No.: 13/921,469

(22) Filed: Jun. 19, 2013

(65) Prior Publication Data
US 2013/0335082 A1      Dec. 19, 2013

(30) Foreign Application Priority Data
Jun. 19, 2012   (DE) .................. 10 2012 210 324

(51) Int. Cl.
*G01V 3/00* (2006.01)
*G01R 33/54* (2006.01)
*G01R 33/561* (2006.01)
*G01R 33/48* (2006.01)

(52) U.S. Cl.
CPC .......... *G01R 33/54* (2013.01); *G01R 33/5615* (2013.01); *G01R 33/5617* (2013.01); *G01R 33/4822* (2013.01); *G01R 33/4826* (2013.01)

(58) Field of Classification Search
CPC .................................... G01R 33/5615
USPC ......................... 324/309, 307, 306
See application file for complete search history.

(56) References Cited

U.S. PATENT DOCUMENTS

| 2011/0113376 | A1 | 5/2011 | Suzuki et al. |
| 2011/0130644 | A1 | 6/2011 | Stemmer |
| 2014/0285195 | A1* | 9/2014 | Stemmer ............ G01R 33/4818 324/309 |
| 2015/0022207 | A1* | 1/2015 | Meyer ................ G01R 33/4818 324/309 |
| 2016/0077179 | A1* | 3/2016 | Tomoda ............... G01R 33/543 324/314 |
| 2016/0109548 | A1* | 4/2016 | Lee ........................ A61B 5/055 324/309 |

* cited by examiner

*Primary Examiner* — Louis Arana
(74) *Attorney, Agent, or Firm* — Schiff Hardin LLP

(57) ABSTRACT

In a method and magnetic resonance (MR) system to acquire MR data in a predetermined volume segment of an examination subject, the data are acquired with at least one echo train that includes at least two signal echoes. The same number of echoes is acquired for each echo train of the at least one echo train, with this number of echoes corresponding to an echo train length. The total number of echoes that are required to acquire the MR data and the echo train length is adapted so that the total number corresponds to a whole number multiple of the echo train length.

11 Claims, 4 Drawing Sheets

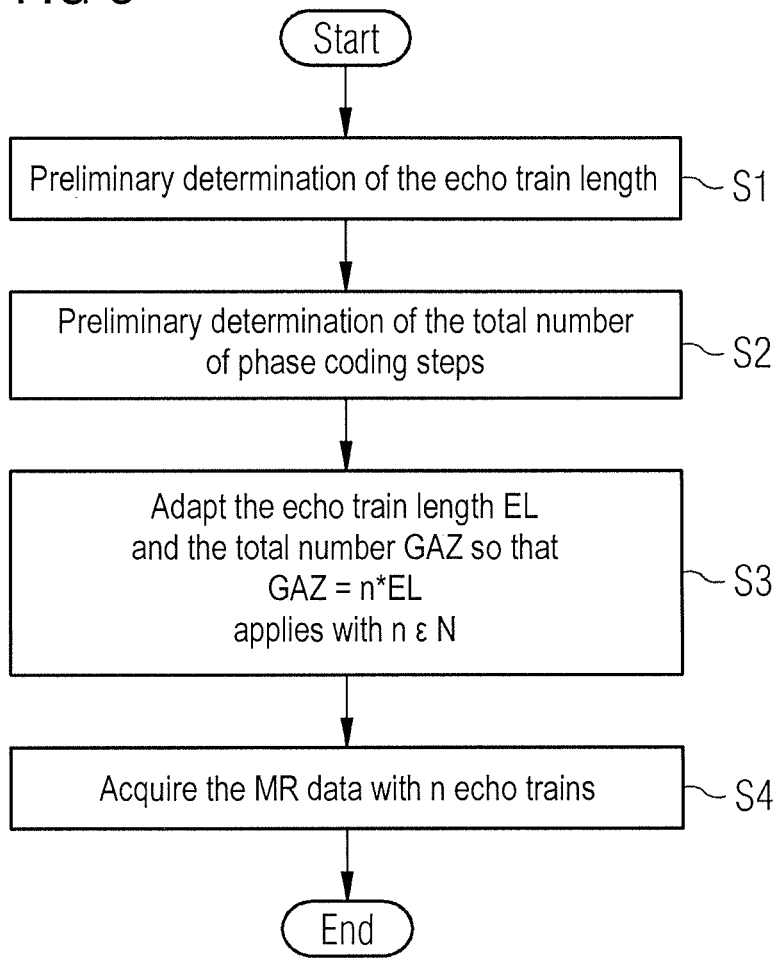

METHOD AND MAGNETIC RESONANCE SYSTEM TO ACQUIRE MR DATA IN A PREDETERMINED VOLUME SEGMENT

BACKGROUND OF THE INVENTION

Field of the Invention

The present invention concerns a method and a magnetic resonance system in order to acquire MR data in a predetermined volume segment of an examination subject with multiple echo trains.

Description of the Prior Art

In magnetic resonance imaging, MR data that are acquired from an examination subject are converted into numerical values that are entered, at respective data entry points, into an electronic memory in an organized manner. The collection of these entered data points is known as k-space. By implementing a Fourier transformation of the data entries in k-space, image data are obtained and a visual image of the examination subject, or a portion thereof, is generated.

According to the prior art, k-space that corresponds to the volume segment to be acquired is scanned by means of echo trains until a previously established set of k-space points has been completely acquired. In acquisition methods with echo trains (after an excitation such as, for example, TSE ("Turbo Spin Echo"), FSE ("Fast Spin Echo") or SPACE ("Sampling Perfection with Application optimized Contrasts using different flip angle Evolutions")), it is frequently the case that only a few still-outstanding k-space points are acquired with the last echo train.

SUMMARY OF THE INVENTION

An object of the present invention is to acquire as many k-space points or echoes as possible, even with the last echo train.

In accordance the present invention, in a method for acquisition of MR data in a predetermined volume segment of an examination subject with a magnetic resonance system, the MR data are acquired with one echo train (but most often with multiple echo trains), with multiple signal echoes being acquired with each of these echo trains. The same number of (different) phase coding steps is thereby executed, or the same number of echoes is acquired, for each of these echo trains. The number of phase coding steps or the number of echoes (one echo is acquired per phase coding step) corresponds to an echo train length, such that each echo train has the same echo train length. The echo train length is also known as a turbo factor, from which it follows that the echo train length is a number, and not a time duration. The total number of all echoes (phase coding steps) that are required (and therefore acquired) to acquire the MR data is adapted to the echo train length, such that this total number corresponds to a whole number multiple of the echo train length.

As used herein the phase coding step is a defined setting of the phase coding gradient or phase coding gradients in the acquisition of the MR data. If each echo train accordingly has an echo train length EL, this means that different phase coding gradient settings are used during the acquisition of the MR data within the scope of the respective echo train EL, so EL echoes are acquired.

For acquisition of the MR data, a differentiation is made between methods that operate with spin echoes or detect spin echoes, and methods that operate with gradient echoes or detect gradient echoes.

When the MR data are acquired with a spin echo method, the acquisition of each echo train begins with an RF excitation, and a refocusing pulse is switched (activated) before each acquisition of each echo of the echo train.

When the MR data are acquired with a gradient echo method, the acquisition of each echo train begins with a magnetization preparation (for example for fat saturation or for inversion), and an RF excitation pulse is switched (activated) before each acquisition of each echo of the echo train. In other words: in the present invention, the gradient echoes detected after a magnetization preparation are combined into an echo train in the gradient echo method, with the number of gradient echoes detected after the corresponding magnetization preparation (which number is constant for each of these echo trains) corresponds to the echo train length.

A first possibility to adapt the total number of all phase coding steps to the echo train length so that this total number corresponds to the whole number multiple of the echo train length is to reduce or increase the echo train length accordingly so that, after the corresponding change to the echo train length, the total number of all phase coding steps corresponds to the whole number multiple of the correspondingly modified echo train length.

A second possibility to adapt the total number of all phase coding steps to the echo train length so that this total number corresponds to the whole number multiple of the echo train length is to reduce or increase the total number of phase coding steps so that the total number of all phase coding steps corresponds to the whole number multiple of the echo train length after the corresponding change of this total number.

Naturally, according to the invention it is also possible to combine the first possibility and second possibility with one another so that both the echo train length and the total number of phase coding steps are modified such that the total number of all phase coding steps corresponds to the whole number multiple of the echo train length after these changes.

If the second possibility is selected, and so the total number of all phase coding steps is reduced, then at least one phase coding gradient setting is not used in the acquisition of the MR data, such that the at least one set of k-space points which would be acquired given this at least one phase coding gradient setting is not acquired. This at least one set of k-space points is selected such that the at least one set of k-space points lies as far as possible from the center of k-space.

This variant according to the invention makes use of the fact that unacquired k-space points at the periphery of k-space have a smaller influence on the quality of the MR data to be acquired (in particular of the MR image to be generated) than unacquired k-space points in the center of k-space.

According to the invention, it is also possible to scan k-space radially.

In radial scanning, k-space is scanned using or along spokes that proceed through the k-space center. Expressed in a different way: one spoke is acquired per phase coding gradient setting so that multiple such spokes are acquired per echo train.

If the number or the set of spokes to be scanned is modified (i.e. reduced or increased) to comply with the requirement according to the invention that the total number of phase coding steps has to correspond to the whole number multiple of the echo train length, the remaining set of spokes scanned in k-space should then be chosen such that k-space is scanned as uniformly or homogeneously as possible. For example, this is achieved by keeping the angle between two adjacent spokes as constant as possible for all spokes.

According to the invention, the predetermined volume segment can be a two-dimensional volume segment (i.e. a slice) or a three-dimensional volume segment.

According to the invention, a two-dimensional volume segment or a slice, is under consideration when only one k-space point is respectively scanned in the direction of the slice thickness.

For non-radial acquisition of a two-dimensional volume segment, only one phase coding gradient is activated that is orthogonal to an additional magnetic field gradient for spatial coding that is activated upon readout of the respective k-space line or column. In the non-radial acquisition of a two-dimensional volume segment, the total number of phase coding steps accordingly corresponds to the number of k-space lines or columns.

In a non-radial acquisition of a three-dimensional volume segment, a first phase coding gradient is activated in a first direction and a second phase coding gradient is activated in a second direction, the first direction being orthogonal to the second direction. An additional magnetic field gradient for spatial coding is additionally activated in a third direction that is orthogonal to both the first direction and the second direction. The additional magnetic field gradient is activated in order to read out a k-space line or column.

The present invention also encompasses a magnetic resonance system for the acquisition of MR data in a predetermined volume segment within an examination subject. The magnetic resonance system includes a basic magnetic field, a gradient field system, one or more RF antennas, and a control device to control the gradient field system and the RF antenna(s), in order to receive measurement signals which are acquired by the RF antenna(s), and to evaluate the measurement signals, as well as to generate the MR image data sets. The magnetic resonance system acquires the MR data with one or (in most cases) with multiple echo trains that respectively include multiple signal echoes. The same number of echoes is detected for each echo train (meaning that each echo train has the same number of phase coding steps). This number of echoes acquired per echo train is called the echo train length, and therefore corresponds to the number of phase coding steps required per echo train. The magnetic resonance system is designed such that the total number of echoes that are acquired to acquire all MR data (and therefore the total number of phase coding steps that are switched to acquire all MR data) is adapted to the echo train length such that the total number of all acquired echoes or all phase coding steps that are used corresponds to the whole number multiple of the echo train length.

As in the method according to the invention, the magnetic resonance system acquires a predetermined number or, respectively, set of k-space points for each of the phase coding steps, with each of these k-space points corresponding to a point in k-space that corresponds to the volume segment.

The advantages of the magnetic resonance system according to the invention essentially correspond to the advantages of the method according to the invention.

Furthermore, the present invention encompasses a computer-readable data storage medium that can be loaded into a memory of a programmable control device or a computer of a magnetic resonance system. All or various embodiments of the method according to the invention that are described above can be executed according to programming instructions encoded in the storage medium that runs in the control device. The programming instructions may require other program means (for example libraries and auxiliary functions) in order to realize the corresponding embodiments of the method. The programming instructions can be source code (C++, for example) that must still be compiled and linked or that must only be interpreted, or can be an executable software code that has only to be loaded into the corresponding computer or control device for execution.

The electronically readable data medium can be a DVD, a magnetic tape or a USB stick on which is stored electronically readable control information. All embodiments according to the invention of the method described above can be implemented when this control information (software) is read from the data medium and stored in a control device or computer of a magnetic resonance system.

The following describes the present invention again from a different point of view.

In a three-dimensional acquisition method (i.e. acquisition method to acquire a three-dimensional volume segment)—for example SPACE—the echo train length or, respectively, the number of phase coding steps is calculated as a multiplication of ky*kz. ky or kz corresponds to the size (i.e. number of k-space point to be scanned) of k-space to be scanned in the y-direction or z-direction. However, for efficiency reasons k-space is presently no longer completely scanned in most cases. Instead of this, specific scanning patterns—for example PAT ("Parallel Acquisition Technique"), Half-Fourier, Elliptical Scanning—are used which dictate those k-space lines that are to be scanned along the x-direction in order to suffer from as little quality loss as possible in spite of the incomplete scanning of k-space. However, the calculation of the phase coding steps according to these defined scanning patterns is difficult and quite complicated in comparison to the aforementioned ky*kz product.

Nevertheless, the echo train length of the corresponding scanning sequences—for example TSE ("Turbo Spin Echo") and variants of this, VIBE with preparation, Turboflash with preparation (for example MPRage ("Magnetization Prepared RApid Gradient Echo")—should be selected such that the total number of k-space lines to be scanned corresponds to a whole number multiple of the echo train length. Otherwise (if this total number does not correspond to the whole number multiple of the echo train length), echo trains with incompletely populated data acquisitions occur, which negatively affects the effectiveness.

In the worst case, for example, according to the prior art a protocol could comprise only two echo trains, wherein the second echo train acquires only one k-space line. In this case, the effectiveness of the acquisition protocol (calculated as a quotient of the number of k-space lines to be acquired, divided by the acquisition time) would be essentially halved. At the same time, however, all RF pulses are nevertheless generated, whereby a correspondingly increased SAR exposure of the patient results.

In that the total number of phase coding steps that are required to acquire the MR data corresponds to a whole number multiple of the echo train length, the same number of k-space lines or columns (or k-space spokes given a radial acquisition) is advantageously acquired with each echo train. In comparison to the prior art, an increase of the efficiency of the protocol thereby results, such that the MR data are either acquired more quickly at (nearly) the same quality of the MR image resulting from this, or lead to an MR image with better quality given the same acquisition duration.

The present invention is particularly suitable for reconstruction of MR images starting from acquired MR data of a three-dimensional volume segment. However, the present invention is naturally not limited to this preferred field of application since the present invention can also be used, for example, to acquire MR data of a two-dimensional volume segment or to acquire MR data which are not used for reconstruction of an MR image.

BRIEF DESCRIPTION OF THE DRAWINGS

FIG. 5 shows a workflow according to the invention for the acquisition of MR data in a three-dimensional volume segment.

DESCRIPTION OF THE PREFERRED EMBODIMENTS

Figure 1:
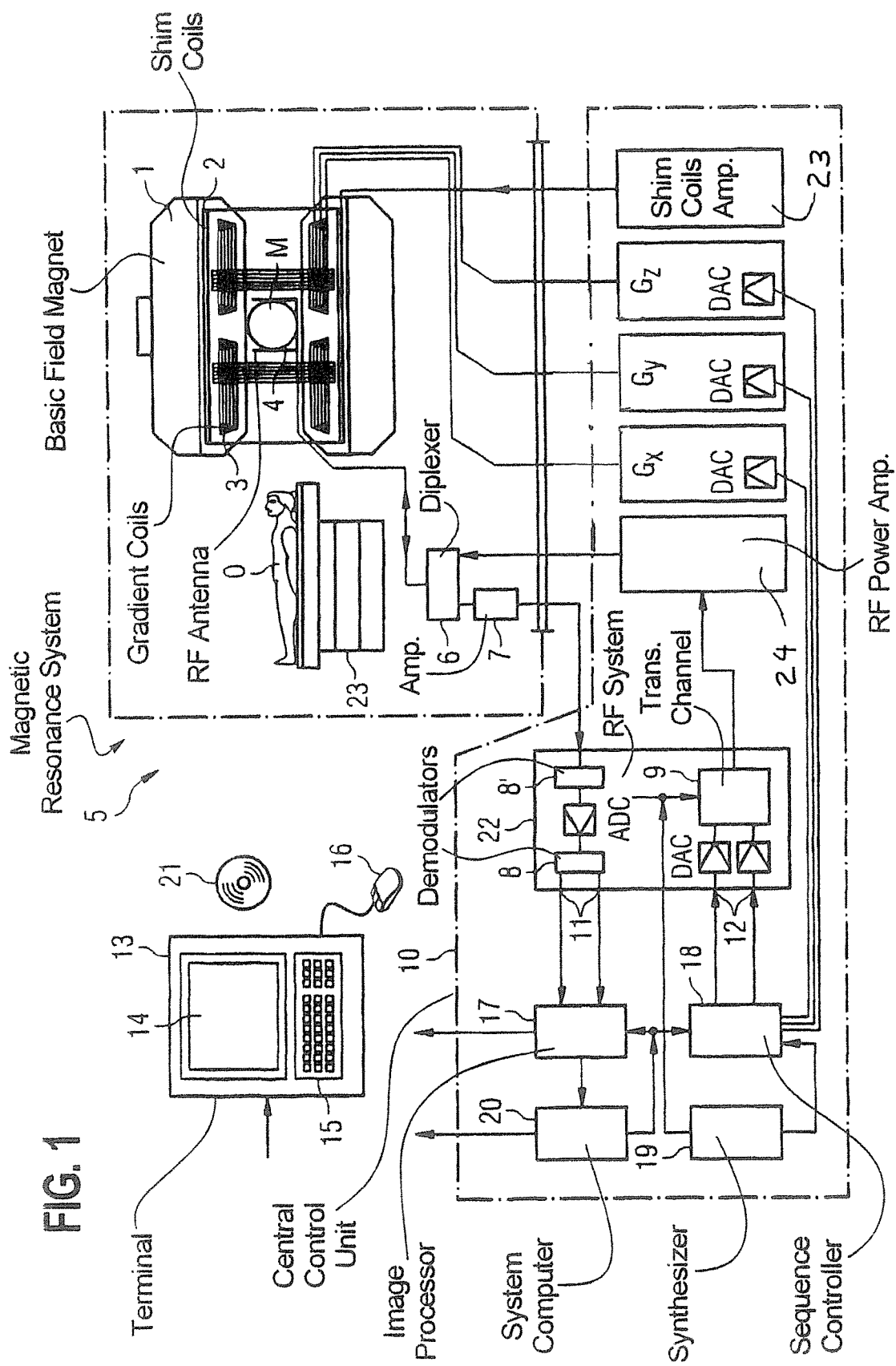
FIG. 1 schematically illustrates a magnetic resonance system according to the invention.

FIG. 1 shows a schematic representation of a magnetic resonance system 5 (of a magnetic resonance imaging or magnetic resonance tomography apparatus). A basic field magnet 1 generates a temporally constant, strong magnetic field for polarization or alignment of the nuclear spins in a volume segment of a subject O, for example of a part of a human body that is to be examined, which body lies on a table 23 and is examined in the magnetic resonance system 5. The high homogeneity of the basic magnetic field that is required for the magnetic resonance measurement (data acquisition) is defined in a typically spherical measurement volume M into which the parts of the human body that are to be examined are introduced. Shim plates made of ferromagnetic material are attached at suitable points to assist the homogeneity requirements, and in particular to eliminate temporally invariable influences. Temporally variable influences are eliminated by shim coils 2, supplied by a shim coils amplifier 23.

A cylindrical gradient coil system 3 which consists of three sub-windings is used in the basic field magnet 1. Each sub-winding is supplied with current by an amplifier to generate a linear (also temporally variable) gradient field in the respective direction of the Cartesian coordinate system. The first sub-winding of the gradient field system 3 thereby generates a gradient $G_x$ in the x-direction; the second sub-winding generates a gradient $G_y$ in the y-direction; and the third sub-winding generates a gradient $G_z$ in the z-direction. The amplifier comprises a digital/analog converter (DAC) that is activated by a sequence controller 18 for time-accurate generation of gradient pulses.

One or more radio-frequency antennas 4 which convert the radio-frequency pulses emitted by a radio-frequency power amplifier 24 into an alternating magnetic field for excitation of the nuclei and alignment of the nuclear spins of the subject O to be examined or, respectively, of the region of the subject O that is to be examined is located within the gradient field system 3. Each radio-frequency antenna 4 is composed of one or more RF transmission coils and multiple RF reception coils in the form of an annular—advantageously linear or matrix-like—arrangement of component coils. The alternating field emanating from the precessing nuclear spins—i.e. normally the nuclear magnetic resonance echo signals caused by a pulse sequence made up of one or more radio-frequency pulses and one or more gradient pulses—is also converted by the RF reception coils of the respective radio-frequency antenna 4 into a voltage (measurement signal) which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the center frequency.

The switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M, and resulting echo signals are scanned via the RF reception coil(s). The correspondingly acquired nuclear magnetic resonance signals are phase-sensitively demodulated to an intermediate frequency in a reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain. An MR image or three-dimensional image data set is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 controls the accurately timed switching (activation) of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which programs are stored on a DVD 21, for example) and the presentation of the generated MR image take place via a terminal 13 that has a keyboard 15, a mouse 16 and a monitor 14.

Figure 2:
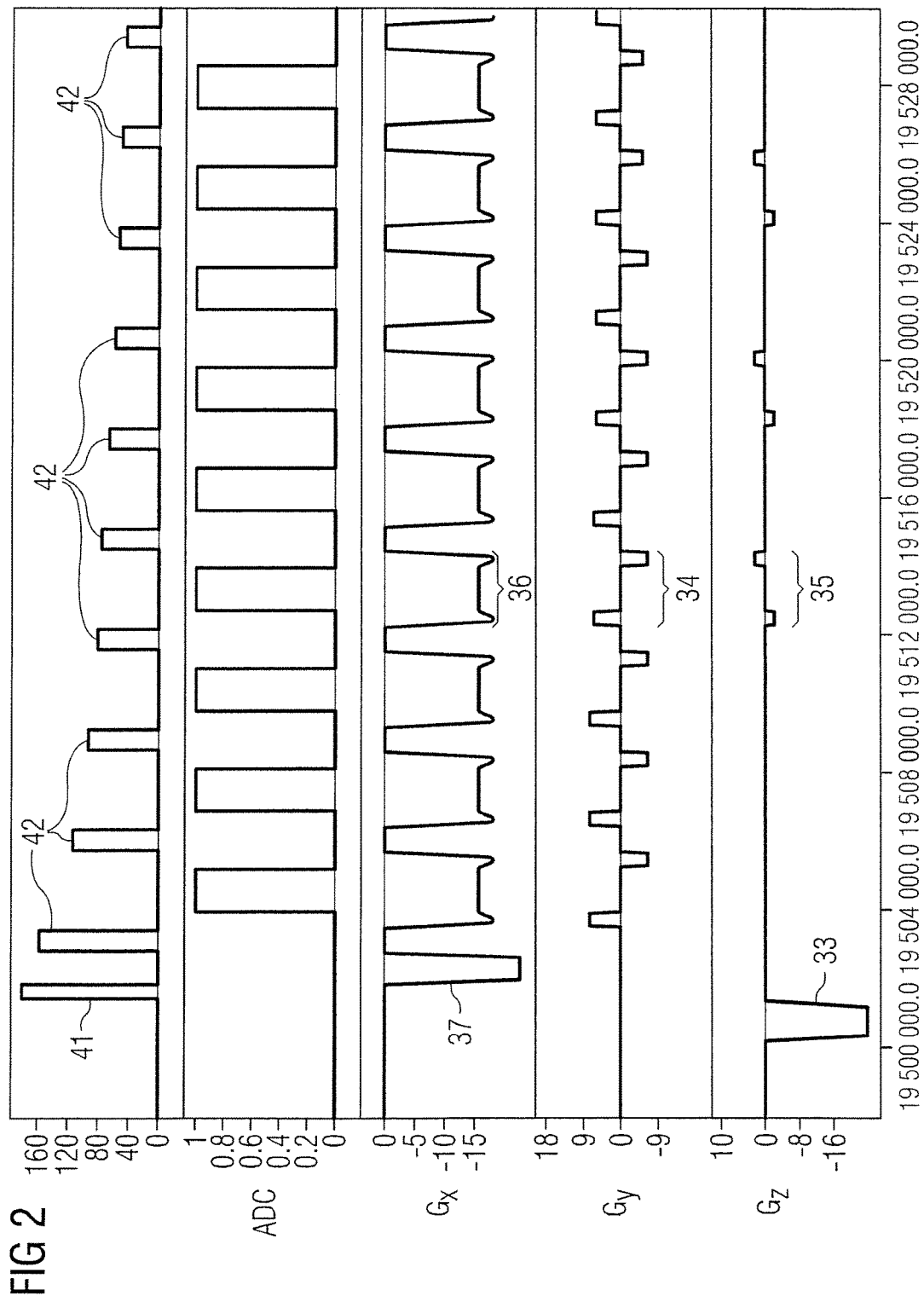
FIG. 2 shows a sequence to acquire MR data within a three-dimensional volume segment is presented.

An example of a pulse sequence for scanning k-space with an echo train is shown in FIG. 2. After a spoiler gradient 33 to destroy "old" magnetization, an RF excitation pulse 41 is switched in order to excite the spins within the predetermined three-dimensional volume segment. The gradient pulse 27 switched in the direction of the x-axis serves to prepare the magnetization before the readout in that the magnetization is dephased before the following refocusing pulse 42.

The MR data are subsequently read out in k-space (where k-space corresponds with the volume segment). To read out a k-space line in the x-direction, a refocusing pulse 42 is respectively switched which is followed by a gradient pulse 34 in the y-direction and a gradient pulse 35 in the z-direction. These two gradient pulses or phase coding gradients 34 and 35 serve for phase coding. A k-space line is read out with these two phase coding gradients 34 and 35, wherein for this a magnetic field gradient 36 is switched in the direction of the x-axis. ADC ("Analog/Digital Conversion") specifies in what time intervals the MR data are acquired and digitized.

After only a single radiation of the RF excitation pulse 41, 120 or more non-selective refocusing pulses 42 (and therefore 120 or more k-space lines) are read out given corresponding phase coding. The presented sequence diagram can correspond to a SPACE sequence.

Figure 3:
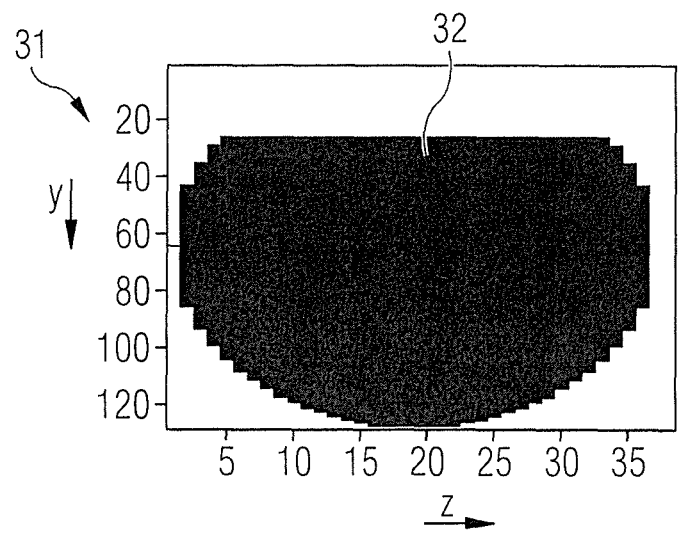
FIGS. 3 and 4 respectively show examples of a scanning pattern.
Figure 4:
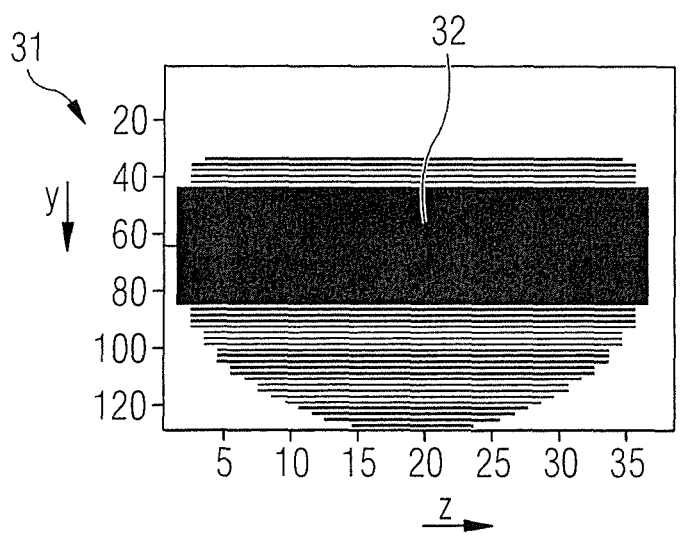

A scanning pattern 32 to scan k-space 31 (which corresponds to the three-dimensional volume segment to be acquired) is respectively shown in FIGS. 3 and 4. In the shown examples, k-space 31 has 128 points along the x-direction, 128 points along the y-direction and 36 points along the z-direction, such that k-space 31 potentially comprises 128*128*36=589,824 points. In each echo train, multiple k-space lines are acquired along the x-direction, wherein the number of these k-space lines acquired per echo train along the x-direction corresponds to the echo train length, which is the same for each echo train. In other words: EL*128 k-space points are acquired per echo train, for example, wherein EL corresponds to the echo train length.

In FIGS. 3 and 4, each point of the scanning pattern 32 corresponds to a k-space line along the x-direction. It is apparent that the k-space lines situated near the k-space center are respectively scanned in both scan patterns 32, while k-space lines are in particular not acquired along the outer edges of k-space 31. For example, if the requirement according to the invention—that the total number of phase coding steps (corresponding to the total number of k-space lines to be acquired according to scanning pattern 32) has to correspond to the whole number multiple of the echo train length—is satisfied in that the total number of k-space lines to be acquired is reduced, the respective scanning pattern 32 can be modified in that additional k-space lines that have an optimally small distance from these edges (advantageously a small distance from the vertex points y=128, z=1 or y=128, z=36) are not acquired. A short distance from the edges or vertices preceding in the x-direction (in FIGS. 3 and 4) thereby corresponds to a large distance from the k-space center.

A method workflow according to the present invention is shown in FIG. 5. In the first Step S1, the same echo train length for all echo trains is preliminarily determined according to certain criteria, while in the second Step S2 the total number of phase coding steps (i.e. the total number of k-space spokes to be acquired given a radial scan and the total number of k-space lines to be acquired given a non-radial scan) is preliminarily determined.

In the following Step S3, the echo train length EL is adapted to the total number GAZ such that the relationship indicated in Equation (1) applies.

$$GAZ = n \times EL, \text{ with } n \in N \quad (1)$$

The relationship described in Equation (1) states that the total number GAZ corresponds to a (positive) whole number multiple of the echo train length EL.

Because the echo train length EL and/or the total number GAZ of the phase coding steps have been accordingly adapted in order to satisfy Equation (1), the MR data are acquired with n echo trains in Step S4.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquisition of magnetic resonance (MR) data, comprising:
    operating an MR data acquisition unit to execute a magnetic resonance data acquisition sequence to excite nuclear spins in a predetermined volume segment of an examination subject, the excited spins producing multiple echo trains each comprising at least two signal echoes and, in said sequence, acquiring MR data from a same number of signal echoes in each of said echo trains, said same number defining an echo train length; and
    operating said MR data acquisition unit to acquire MR data from a total number of signal echoes collectively from all of said echo trains, and adapting the echo train length and said total number to each other to cause said total number to be a whole number multiple of the echo train length.

2. A method as claimed in claim 1 comprising:
    operating said MR data acquisition unit with a spin echo sequence as said MR data acquisition sequence;
    in said spin echo sequence, executing an RF excitation of nuclear spins in said volume segment of said examination subject before acquiring MR data from the respective echo trains; and
    activating a refocusing pulse in said spin echo sequence before acquisition of each signal echo in a respective echo train.

3. A method as claimed in claim 1 comprising operating said MR data acquisition unit with a gradient echo sequence as said MR data acquisition sequence.

4. A method as claimed in claim 1 comprising adapting said total number of echoes and said echo train length to each other by reducing or increasing said echo train length.

5. A method as claimed in claim 1 comprising adapting said total number of echoes and said echo train length by reducing or increasing said total number of echoes.

6. A method as claimed in claim 5 comprising:
    entering the acquired MR data into k-space at respective k-space points;
    adapting said total number and said echo train length to one another by reducing said total number, thereby causing MR data not to be acquired from at least one signal echo; and
    selecting said predetermined set of k-space points that would be filled with MR data from said at least one signal echo to be as far as possible from a center of k-space.

7. A method as claimed in claim 6 comprising entering said MR data into said k-space points along radial trajectories.

8. A method as claimed in claim 6 comprising selecting said predetermined volume segment as a two-dimensional volume segment or a three-dimensional volume segment.

9. A method as claimed in claim 6 comprising:
    in said MR data acquisition sequence, activating a first phase coding gradient in a first spatial direction and activating a second phase coding gradient in a second spatial direction;
    in said MR data acquisition sequence, activating an additional magnetic field gradient for spatial coding in a third spatial direction that is orthogonal to said first spatial direction and to said second spatial direction; and
    entering said MR data into said predetermined set of k-space points while said additional magnetic field gradient is activated.

10. A magnetic resonance (MR) apparatus comprising:
an MR data acquisition unit;
a control unit configured to operate said MR data acquisition unit to execute a magnetic resonance data acquisition sequence to excite nuclear spins in a predetermined volume segment of an examination subject, the excited spins producing multiple echo trains each comprising at least two signal echoes and, in said sequence, acquiring MR data from a same number of signal echoes in each of said echo trains, said same number defining an echo train length; and
said control unit being configured to operate said MR data acquisition unit to acquire MR data from a total number of signal echoes collectively from all of said echo trains, and to adapt the echo train length and said total number to each other to cause said total number to be a whole number multiple of the echo train length.

11. A non-transitory, computer-readable data storage medium encoded with programming instructions, said storage medium being loaded into a computerized control unit of a magnetic (MR) apparatus that comprises an MR data acquisition unit, said programming instructions causing said control unit to:

operate said MR data acquisition unit to execute a magnetic resonance data acquisition sequence to excite nuclear spins in a predetermined volume segment of an examination subject, the excited spins producing multiple echo trains each comprising at least two signal echoes and, in said sequence, acquiring MR data from a same number of signal echoes in each of said echo trains, said same number defining an echo train length; and operate said MR data acquisition unit to acquire MR data from a total number of signal echoes collectively from all of said echo trains, and adapt the echo train length and said total number to each other to cause said total number to be a whole number multiple of the echo train length.

* * * * *